United States Patent
Meroth et al.

(10) Patent No.: US 6,690,305 B2
(45) Date of Patent: Feb. 10, 2004

(54) METHOD OF DATA TRANSMISSION OVER A BUS SYSTEM

(75) Inventors: Ansgar Meroth, Leonberg (DE); Thomas Geisler, Karlsruhe (DE)

(73) Assignee: Robert Bosch GmbH, Stuttgart (DE)

( * ) Notice: Subject to any disclaimer, the term of this patent is extended or adjusted under 35 U.S.C. 154(b) by 580 days.

(21) Appl. No.: 09/748,328

(22) Filed: Dec. 26, 2000

(65) Prior Publication Data

US 2001/0019311 A1 Sep. 6, 2001

(30) Foreign Application Priority Data

Dec. 24, 1999 (DE) .......................... 199 62 971

(51) Int. Cl.$^7$ ............................................. H03M 7/46
(52) U.S. Cl. ............................ 341/63; 341/51; 341/59; 341/67
(58) Field of Search ........................... 341/63, 67, 51, 341/59; 382/246

(56) References Cited

U.S. PATENT DOCUMENTS

| | | | | |
|---|---|---|---|---|
| 5,146,221 A | * | 9/1992 | Whiting et al. | 341/67 |
| 5,359,676 A | * | 10/1994 | Fan | 382/246 |
| 5,506,580 A | * | 4/1996 | Whiting et al. | 341/51 |
| 5,874,907 A | * | 2/1999 | Craft | 341/51 |
| 5,969,649 A | * | 10/1999 | Ashley et al. | 341/59 |

* cited by examiner

*Primary Examiner*—Jean Jeanglaude
(74) *Attorney, Agent, or Firm*—Kenyon & Kenyon

(57) ABSTRACT

A method of data transmission from a data source to a data sink via a bus system. Run length encoding of the data to be transmitted is performed, where data units 1; 1' having two data elements 2, 3; 2', 3' are used, the first data element 2 of which contains a repeat factor n of a datum D, and the second data element 3 contains the corresponding datum D; and at least one predefined repeat factor m in the first data element 2' is defined as a flag for the presence of additional information ZI, where the second data element 3' contains the additional information ZI.

8 Claims, 1 Drawing Sheet

METHOD OF DATA TRANSMISSION OVER A BUS SYSTEM

FIELD OF THE INVENTION

The present invention relates to a method of data transmission from a data source to a data sink over a bus system.

BACKGROUND INFORMATION

A plurality of ready-to-use multimedia bus systems for simultaneous data transmission of multiple audio and video channels are used in accordance with the related art. However, most of these bus systems are not suitable for use in the automotive field because they are too complicated technically and their immunity to vibrations, temperature fluctuations and other external influences is too low. In addition, these systems have modules that are too large for use in the automotive field and therefore they are not used in this field.

According to the related art, the D2B bus system and its successor, the MOST (media oriented systems transport) bus system, are used specifically in the automotive field where components with smaller temporary and fixed memories are used. However, the most important system parameters of the MOST bus are designed for data transmission of audio data.

An object of the present invention is in general to create a means of data transmission of image data from a data source to a data sink over a bus system that can be used in the automotive field, where the additional information required for data transmission over a synchronous bus can easily be integrated into the existing data protocol.

Methods of achieving this object according to the related art are described below.

Data transmission of moving images is also possible by means of an MPEG (motion picture expert groups) compression method.

The fact that the MPEG compression method is subject to loss and thus not suitable for transmission of high quality GUI (graphical user interface) graphics has proven to be a disadvantage of this method. Furthermore, compression in the MPEG compression method is very complicated.

In another method of data transmission of pixel-oriented image data over a MOST bus, another compression method, namely the Lempel-Ziv algorithm, is used. In this method, a data sequence to be compressed is analyzed for repeats of subsequences, with recurring elements being stored in a code table and the subsequences being replaced by an assigned code.

One disadvantage of this known approach is that a table of an unknown size must be created for decompression. Working with large temporary tables is a disadvantage for implementation in embedded systems.

Finally, another method involves compression by means of a run length encoding method, referred to below as the RLE method. If a data stream compressed by an RLE method is transmitted over a bus system, certain additional information must be added to it to allow appropriate processing by a data sink.

SUMMARY OF THE INVENTION

The method according to the present invention has the advantage in comparison with the known methods that it provides a simple data protocol for synchronous data buses and a simple and sturdy data transmission of pixel-oriented image data, in particular compressed data with certain additional information over a bus system. An existing data format such as that stored temporarily or permanently within an embedded system is made busable through minor modifications, with the modified data format being compatible with the original data format.

An idea on which the present invention is based is that the method of data transmission over a bus system involves definition of at least one predefined repeat factor in the first data element as a flag for the presence of additional information, where the second data element contains the additional information.

This creates a simple data protocol with which additional information on a compressed data stream is transmitted elegantly over a bus system. In this way, predefined repeat factors are assigned to the specific code to implement the specific protocol. This permits a simple data protocol, e.g., for synchronous bus systems. The additional data volume due to the additional information can thus be reduced.

According to a preferred refinement, the repeat factors are natural numbers in an interval from "0" to "255." This is obtained from the 256 different data values in an 8-bit byte.

According to another embodiment, the predefined repeat factor is preferably "0" and/or "1" as a flag for the presence of additional information. In this modification, coding is preferably performed by the repeat factors which do not have any meaning per se as the identifiers flagging a repeat of a certain data.

According to another preferred refinement, additional repeat factors different from "0" and/or "1" are used as flags for the presence of additional information which is preferably in the upper range of the above-mentioned interval. Thus, additional repeat factors are available for the case when two repeat factors are not sufficient. Since data usually occurs with smaller repeats, higher repeat factors can be selected in particular.

According to another preferred embodiment, the method of data transmission of compressed data is used, where the data to be transmitted is designed as pixel-oriented image data, for example. Thus, data transmission of compressed image data is guaranteed.

According to another preferred embodiment, the bus system is designed as a synchronous MOST bus system. This bus system is intended for use in the automotive field in particular.

According to another preferred refinement, the additional information represents among other things the beginning or the end of a logical data unit, a neutral data element as a filler, the sender or the recipient of a data unit, additional information about the type of run length encoding used, additional information about error detection or additional information about general bus management. Such additional information must be transmitted over a synchronous bus system together with the compressed data stream so that the data transmitted can be processed accordingly by the data sink.

DETAILED DESCRIPTION

Figure 1:
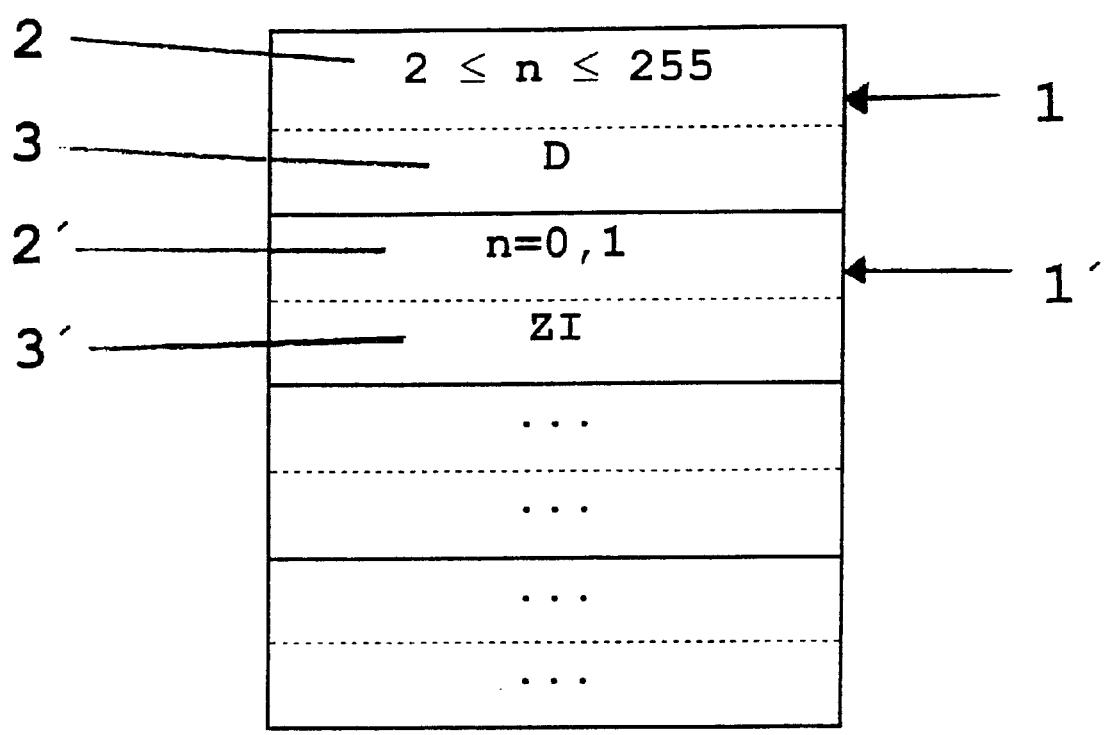
FIG. 1 shows a schematic diagram of the method according to the present invention as an embodiment of the present invention.

FIG. 1 illustrates the principle of the method according to the present invention as per an embodiment of the present invention. Individual data units 1; 1' of a data packet are composed of two data elements 2, 3; 2', 3'. First data element 2 of data unit 1 has a repeat factor n of a datum D, where corresponding datum D is stored in second data element 3 of data unit 1.

In the embodiment according to the present invention, the repeat factor m=0, 1 is predefined as a flag for the presence of additional information ZI. Respective predefined repeat factors m are stored in first data element 2', namely m=0 and 1 in this embodiment, and corresponding additional information ZI is stored in second data element 3' of data unit 1. The sequence of the method is explained below according to one embodiment of the present invention.

Data sent from a data source to a data sink is compressed by an RLE method where there is no data loss. An object of this method is to combine recurring data elements and store them with the number of repeats. RLE-compressed data records thus contain units 1 composed of a first data element 2 for storage of repeat factor n of datum D to be stored and a second data element 3 in which datum D that is to be stored is in fact stored. RLE-compressed data records may also have structural elements for flagging whether datum D or successive data is encoded by repeat factor n and datum D to be repeated or whether datum D is to be interpreted without a respective repeat factor. The RLE method is a format which organizes data for transmission, e.g., by bytes.

In this embodiment, a compressed data stream is transmitted over a synchronous bus system by the RLE method, where certain additional information is necessary, as already mentioned above, in order for the data sink to be able to utilize the data transmitted. With a synchronous bus system such as the MOST bus system, data is sent continuously at a constant data rate without any interruption because this is intended primarily for an audio data stream. Such synchronous buses do not have any outstanding moments, so that certain additional information is indispensable.

Such additional information ZI includes, for example, the beginning or the end of a logical data unit such as an individual data image, a neutral data element as a filler, which is an important function with synchronous buses over which no useful data is being transmitted at the moment, a sender or a recipient of a data unit, or it may be additional information ZI about the type of RLE method used, additional information ZI about error detection or additional information ZI about general bus management.

With the help of this general information ZI, transmitted datum D can be analyzed and processed appropriately.

A flag is now necessary to indicate whether it is a list "repeat factor n—datum D" or "additional information ZI" in the following byte.

The procedure is as follows:

Repeat factors n are natural numbers with an interval I from "0" to "255" because a byte with 8 bits may have a total of 256 different values. A repeat factor of "0" does not in principle have any meaning and thus does not occur. Likewise, repeat factor "1" does not provide any additional information if the format is defined so unambiguously that a single datum D which is not compressible occurs individually and is not provided with a repeat factor n.

Thus, at least the two repeat factors "0" and/or "1" are available as flags indicating the presence of additional information ZI. Additional information ZI attached to RLE data is then encoded into data words and is composed of a first data element 2' and a data element 3', with repeat factors m=0 and/or m=1 being predefined in the corresponding format as embodiments of the present invention such that they identify the presence of a following piece of additional information ZI. Actual additional information ZI is stored in corresponding data element 3'.

If repeat factor "0" is not sufficient for flagging, then additional repeat factors m from interval I can be predefined for the flag such that additional information ZI follows. In the embodiment according to the present invention, repeat factor "1" is also predefined because it becomes useless as described above when the data element containing the actual datum D is characterized as standing alone without any repeat factor n.

If these two repeat factors "0" and/or "1" are not enough to flag the presence of additional information ZI, then additional repeat factors m which are different from "0" and/or "1" are used as flags which are suitably in the upper range of interval I. Experience has shown that repeat factors having smaller values are used more often than repeat factors having larger values, so that factors 255, 254, 253, . . . , etc. are preferably used as additional repeat factors m.

The above embodiment of the present invention creates a method of data transmission with which compressed pixel-oriented image data can be transmitted advantageously over a synchronous MOST bus with appropriate additional information. An existing data format is made busable through slight modifications, with the modified data format being compatible with the original data format.

It is especially advantageous to use the method for data transmission over the MOST bus to an instrument display in a motor vehicle, because a graphic display of the simplest possible structure must be selected for reasons of simplicity alone. Due to this simple structure of the image data to be displayed, repeats of the same data elements are especially common.

Although the present invention was described above with reference to a preferred embodiment, it is not limited to that but instead can be modified in a variety of ways.

The present invention can be used in particular for any desired bus structures which allow run length encoding.

What is claimed is:

1. A method of transmitting data from a data source to a data sink via a bus system, comprising the steps of:

run length encoding the data to be transmitted using data units having first and second data elements, the first data element containing a repeat factor of a datum, the second data element containing a corresponding datum; and defining at least one predefined additional repeat factor in the first data element as a flag for the presence of additional information, the second data element containing the additional information.

2. The method according to claim 1, wherein the repeat factors are natural numbers in an interval from 0 to 255.

3. The method according to claim 1, wherein the at least one predefined additional repeat factor is at least one of 0 and 1.

4. The method according to claim 3, wherein the at least one predefined additional repeat factor includes factors different from 0 and 1 used as flags for the presence of additional information in an upper range of an interval.

5. The method according to claim 1, further comprising the step of transmitting compressed data.

6. The method according to claim 1, wherein the data is pixel-oriented image data.

7. The method according to claim 1, wherein the bus system is a synchronous media oriented systems transport (MOST) bus system.

8. The method according to claim 1, wherein the additional information represents at least one of (a) a beginning of a logical data unit, (b) an end of a logical data unit, (c) a neutral data element as a filler, (c) a sender of a data unit, (e) a recipient of a data unit, (f) additional information about a type of run length encoding, (g) additional information about error detection, and (h) additional information about general bus management.

* * * * *